United States Patent [19]
Nystrom

[11] Patent Number: 5,754,421
[45] Date of Patent: May 19, 1998

[54] POWER MONITORING

[75] Inventor: Robert W. Nystrom, Oxford, Mass.

[73] Assignee: Load Controls, Incorporated, Sturbridge, Mass.

[21] Appl. No.: 499,749

[22] Filed: Jul. 7, 1995

Related U.S. Application Data

[62] Division of Ser. No. 240,323, May 10, 1994, Pat. No. 5,467,012.

[51] Int. Cl.$^6$ .................................................. H02M 5/10
[52] U.S. Cl. .............................. 363/155; 363/2; 363/156
[58] Field of Search .................................. 363/1, 2, 148, 363/152, 153, 64, 155, 156; 323/212, 213, 215, 216, 332, 355, 356, 361

[56] References Cited

U.S. PATENT DOCUMENTS 4,689,735  8/1987  Young ........................................ 363/155
5,109,327  4/1992  Griffin ...................................... 363/2 X
5,187,654  2/1993  Felippe ..................................... 363/155

*Primary Examiner*—Stuart N. Hecker
*Assistant Examiner*—Y. J. Han
*Attorney, Agent, or Firm*—Fish & Richardson P.C.

[57] ABSTRACT

Electrical power monitoring apparatus comprises a loop and a first conductor. A current sensor coupled to the first conductor provides a current signal that is representative of the current in the first conductor. A voltage sensor coupled at least to the first conductor provides a voltage signal that is representative of the voltage on the first conductor relative to that on a reference terminal. A multiplier coupled to the current sensor and voltage sensor has a power output which provides a power signal that is proportional to the instantaneous value of electrical power carried by the first conductor. A calibration circuit in the loop has an input coupled to the power output and has an adjustable output. A current regulator in the loop has an input coupled to the adjustable output to maintain the current in the loop between predetermined minimum and maximum loop current values.

5 Claims, 3 Drawing Sheets

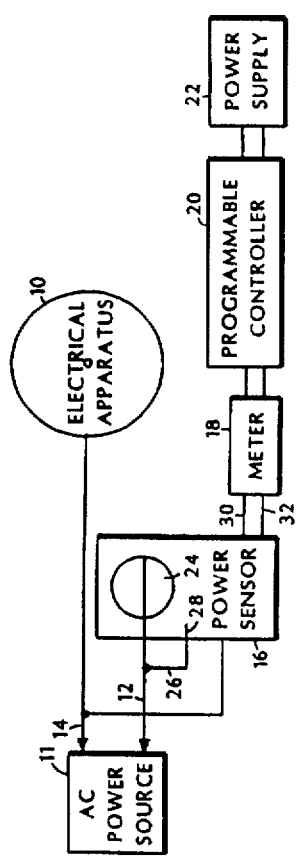
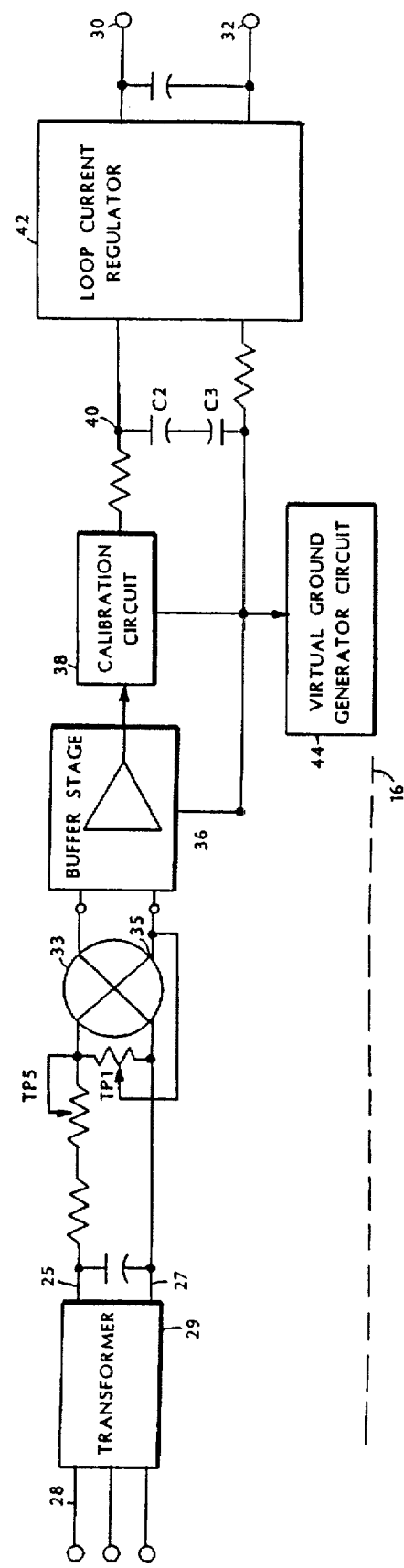

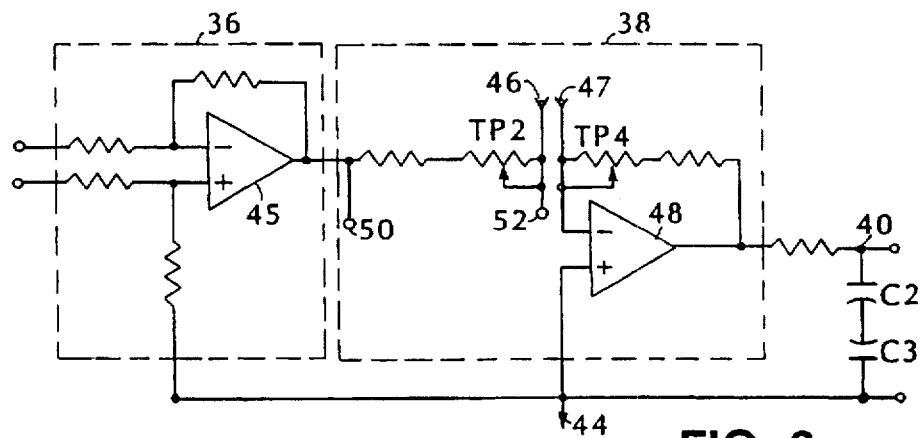
FIG. 3
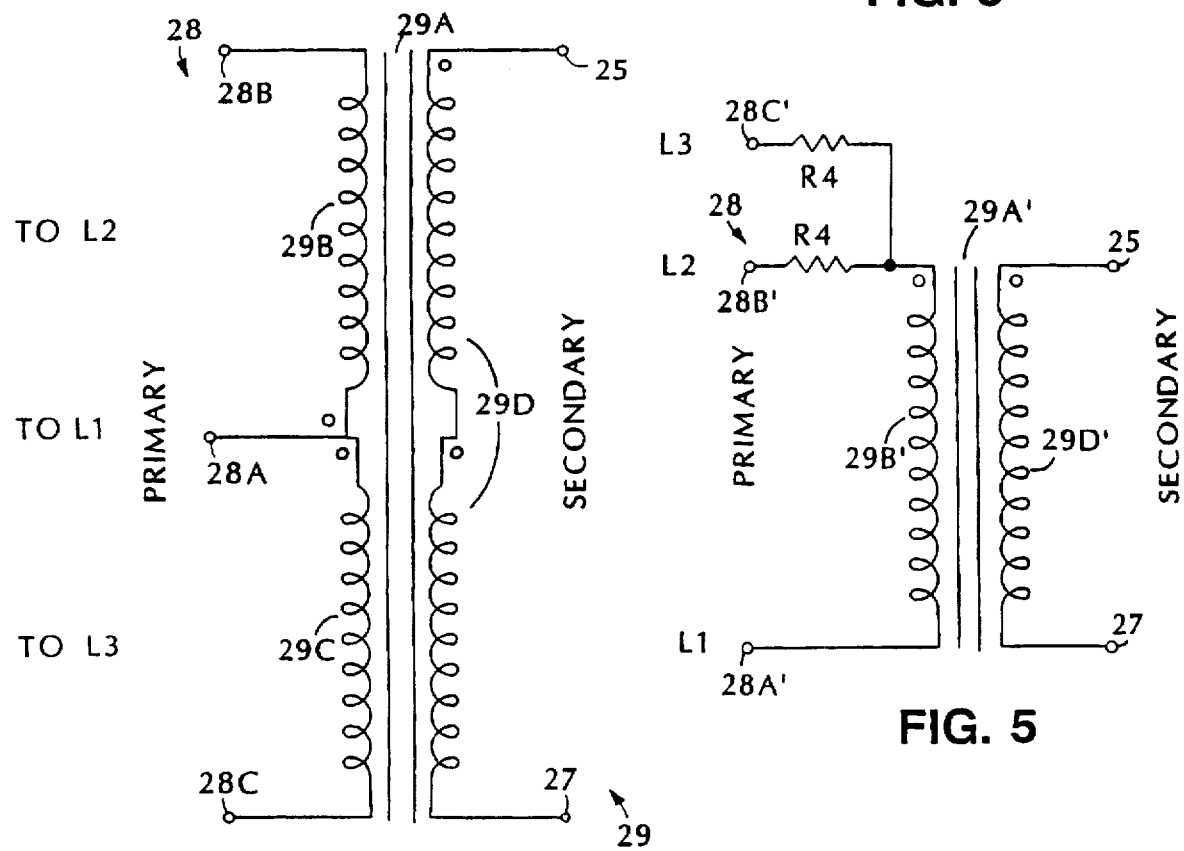
FIG. 4
FIG. 5

POWER MONITORING

This application is a division of application Ser. No. 08/240,323 filed May 10, 1994, now U.S. Pat. No. 5,467,012.

This invention relates in general to power monitoring and more specifically to two-wire power monitoring.

In many industrial situations monitoring the load on electrical apparatus, such as a motor, provides valuable information, such as feed rates, mixture viscosity, tool condition, pump or fan flow, beginning or end of process, obstructions, overload points and loss of load. Load information can then be used by programmable controllers to make desirable control decisions.

Although current may be monitored to indicate load conditions, monitoring power offers advantages unavailable with current monitoring. For example, for a lightly loaded induction motor, the power factor is low so the current is relatively high. As the motor is loaded, the power factor increases, but the rate of change of the motor current is low until the motor load reaches about fifty percent of capacity. A current monitor is thus a poor detector of no-load and low-load problems.

Power monitoring is advantageous because power consumption is low for light loads and increases regularly as the load increases. Power monitoring thus provides useful load information at all load levels.

Two-wire sensors are typically used in processing applications to monitor pressure, temperature and other parameters. The term "two-wire" refers to a class of instruments that are wired in series (that is, in a loop). Two-wire sensors are typically connected to a loop that includes a DC power supply, an indicating meter, and a computer or programmable controller. Typically, the sensor regulates the loop current within a standard range of four and 20 milliamps; where a four-milliamp loop current represents a zero state input, and a 20-milliamp loop current indicates full capacity.

It is generally desirable to use the four-milliamp "idle" current to supply the operating current for the current sensor. Such two-wire sensors are nominally referred to as loop-powered sensors.

It is an important object of the present invention to provide improved methods and means for monitoring power.

In general, in one aspect, the invention features: a transformer; a Hall cell for receiving a signal proportional to a current signal, having a voltage input for receiving a voltage signal from the transformer, and a power output for providing a power signal proportional to the product of the voltage signal, current signal and power factor; and a current regulating device for receiving a signal representative of the power signal from the Hall cell and for regulating the loop current of a loop.

There may be a calibration circuit that may be adjusted for calibrating the power sensor with a calibration load. The calibration circuit may include a variable resistor for adjusting the full scale capacity of the sensor once it has been calibrated.

In another aspect in a three-phase system, the invention features a dual primary transformer comprising two large-turn primaries wound on the same core with a secondary winding so that the voltage across the secondary terminals is in phase with the difference voltage received by the input terminals.

In another aspect, the invention features a single primary transformer comprising one primary winding, two resistors, and a secondary winding. As is the case for the dual primary transformer, the voltage across the secondary winding is in phase with the difference voltage on two of the three line phases.

Other features, objects and advantages of the invention will become apparent from the following detailed description when read in connection with the accompanying drawings in which:

FIG. 1 is a block diagram of an exemplary embodiment of the invention;

FIG. 2 is a combined block schematic-circuit diagram illustrating the logical arrangement of a system according to the invention;

FIG. 3 is a schematic circuit diagram of a buffer stage, a calibration circuit, and an averaging filter;

FIG. 4 is a schematic diagram of a dual primary transformer according to the invention;

FIG. 5 is a schematic diagram of a single primary transformer according to the invention.

Figure 6:
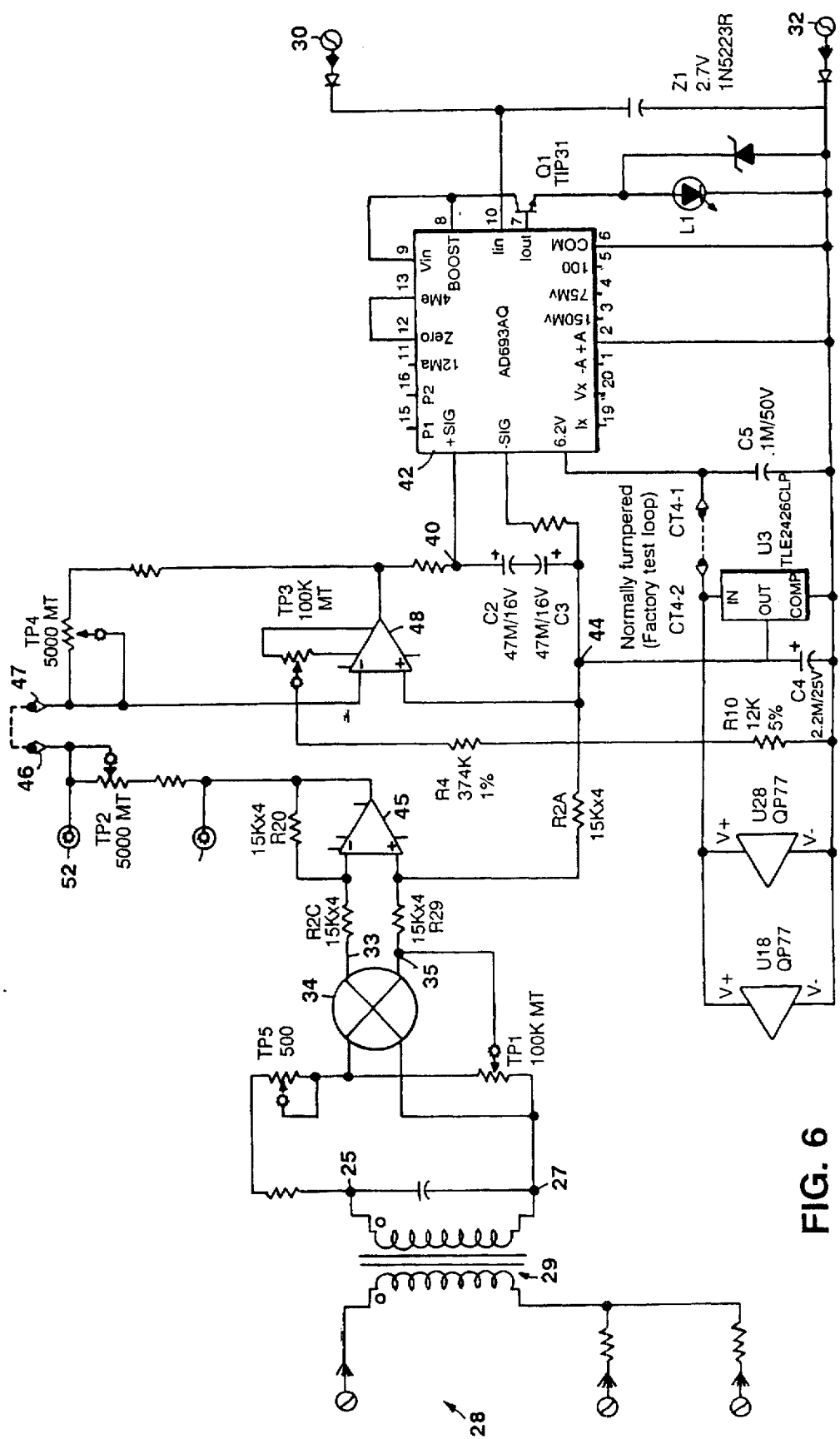
FIG. 6 is a schematic circuit diagram of an exemplary embodiment of a system according to the invention.

With reference now to the drawings and more particularly FIG. 1 thereof, there is shown a block diagram illustrating an embodiment of the invention. Electrical apparatus 10 has two input lines, power line 12 and neutral or ground line 14, connected to an AC power source 11. Power line 12 passes through a current-sensing or detection window 24 in power sensor 16. A voltage sample input line 26 is connected from power line 12 to voltage sample input terminal 28. There may be a number of voltage sample input terminals for accommodating different voltages and phases desired for electrical apparatus 10. Lines 30 and 32 connect the output of power sensor 16 to a loop comprising meter 18, programmable controller 20 and power supply 22.

Current-sensing window 24 is a detection window of a Hall cell that senses the magnetic field around power line 12. Detection window 24 is in a toroidal magnetic concentrator with a Hall effect device or cell in a gap in the concentrator. The Hall cell also receives a voltage signal from voltage sample input terminal 28 to provide an output power signal proportional to the product of the current through and the voltage on power line 12. The Hall cell output is linearly related to this product so there are no distortion products introduced between electrical apparatus 10 and power sensor 16.

Referring to FIG. 2 there is shown a combined block schematic-circuit diagram illustrating the logical arrangement of a system according to the invention. Corresponding elements are identified by the same reference symbol throughout the drawings. Voltage sample input terminal 28 is connected to one end of a primary winding of transformer 29. The terminal ends, 25 and 27, of the secondary winding of transformer 29 are coupled across Hall cell 34 by a compensation network which includes trimpots TP1 and TP5. Trimpot TP1 corrects for cell nonlinearities, and trimpot TP5 compensates for cell sensitivity variations. The voltage across output terminals 33 and 35 of Hall cell 34 is a differential AC voltage proportional to the power transferred to electrical apparatus 10 through power line 12. Buffer stage 36 is a unity gain differential instrumentation amplifier that converts the differential output voltage across output terminals 33 and 35 of Hall cell 34 to a single-ended signal.

Calibration circuit 38 is connected to the output of buffer stage 36 and provides a means for calibrating the power sensor 16 with a calibration load, as well as a means for adjusting the full scale capacity of the sensor once it has been calibrated. Averaging filter 40 couples the output from calibration circuit 38 to loop current regulator 42. Capacitors C2 and C3 may be connected in a nonpolar configuration to prevent damage if sensor 16 is improperly installed.

Loop current regulator 42, typically a commercially available Analog Device AD693AQ integrated circuit (IC), receives a differential input signal from averaging filter 40 and provides a regulated output loop current between four to 20 milliamps to terminals 30 and 32. This IC has a low idle current in the range of one to two milliamps and a pin furnishing up to two milliamps of current to power buffer stage 36 and calibration circuit 38 allowing the sensor to be loop powered.

Virtual ground reference generator circuit 44 provides a virtual ground reference for gain stage 36, calibration circuit 38, and averaging filter 40.

Referring to FIG. 3, there is shown a schematic circuit diagram of buffer stage 36, exemplary calibration circuit 38, and averaging filter 40. Calibration circuit 38 comprises operational amplifier 48 configured as an inverter with feedback trimpot TP4 to adjust for cell differences and normalize the output. One terminal of trimpot TP2 is coupled to the output of buffer stage 36 and the other terminal 46 of trimpot TP2 is coupled to inverting input terminal 47 of operational amplifier 48, by jumpering across terminals 46 and 47.

Connecting operational amplifier 48 as an inverter provides linear gain to facilitate adjusting the full scale capacity of sensor 16. Calibration may be achieved as follows. Trimpot TP2 is adjusted to correspond to a desired maximum value of power to be monitored by sensor 16; the power may be measured in various calibration units (e.g.; kilowatts, horsepower, percent). With terminals 46 and 47 jumpered, the sensor is connected to a calibration load, and trimpot TP4 is adjusted so that sensor 16 regulates the loop current to its maximum value. Full scale adjustment of sensor 16 is then accomplished by removing the jumper between terminals 46 and 47 and adjusting the resistance of trimpot TP2, as measured across terminals 50 and 52, to the value that corresponds to the desired full scale power capacity of the sensor. The major advantage is the ohmic value directly relates to the calibration units; e.g., 50,000 ohms=50 HP; 10,000 ohms=10 HP, etc.

The invention has the advantage that it may be loop-powered. The invention may monitor single-phase power and three-phase power, including three-phase variable frequency power. The invention is completely line isolated. Full scale capacity setting is accomplished by adjusting a single variable resistor while maintaining a good impedance match to the load.

Referring to FIG. 4, there is shown an exemplary dual primary transformer operated off a three-phase supply. Input terminals 28A, 28B and 28C are connected to lines L1, L2 and L3, respectively, of a three-phase supply. Transformer 29 includes core 29A, primary windings 29B and 29C and secondary winding 29D for providing an output signal between terminals 25 and 27 in phase with the signal on line L1.

These phase supplies are 120° out of phase. Normally a precision phase shifter is require to align the voltage and current signals. A feature of the dual primary transformer is that it furnishes a desired phase shift for power monitoring economically and free from complexity.

Referring to FIG. 5, there is shown an exemplary single primary transformer with resistors for operating off a three-phase supply. Single primary transformer 29' comprises core 29A', first, second, and third input terminals 28A', 28B' and 28C', respectively, connected to lines L1, L2 and L3 of a three-phase supply, primary winding 29B' having a first end connected to the first input terminal 28A', and a second end connected by a first resistor R4 to the second input terminal 28B' and connected by a second resistor R4 to the third input terminal 28C' and a secondary winding 29D' for providing an output signal in phase with the L1 phase on input terminal 28A'.

The single primary transformer embodiment furnishes the desired phase shift for power monitoring. This embodiment is smaller. In addition, the two resistors function to limit fault current when connected to an electronic variable frequency drive.

Having described the structural arrangement of embodiments of power monitoring transformers according to the invention, principles of operation will be described. When measuring power, and in particular three-phase power, some reference must be chosen between current and voltage in order to determine power factor and fulfill the power equation of $V \times I \times Pf \times \sqrt{3}$. Unity power factor by definition requires the current I to be in phase with the voltage V. It is convenient to assume a three-phase source with phases 120 degrees apart, and a resistive load, wye or delta. It is necessary to establish a reference voltage in phase and amplitude to compare to a current signal for power measuring. Taking a voltage reference from the three-phase line by placing a transformer across two of the phases provides a resulting voltage on the secondary out of phase with the current in any of the three legs. The voltage signal may then be passed through a phase-shift network, analog or digital, and for unity power factor may be adjusted to be in phase with the current. This approach takes up space, requires the phase shifter to be adjusted and is frequency sensitive; that is, the phase shifter needs to be adjusted for 50 Hz or 60 Hz lines.

A feature of the invention is to use the transformer itself to introduce the desired phase shift. Connecting the primary windings 29B and 29C out of phase as in FIG. 4 causes the resulting secondary signal to be exactly in phase with a current signal in the leg at terminal 28A connected to the junction of the two out-of-phase primaries 29B and 29C. For example, if the transformer is connected to lines L1, L2 and L3 at terminals 28A, 28B and 28C with line L1 connected to terminal 28A at the junction of primary windings 29B and 29C, then the transformer secondary 29D will be in phase with the current in line L1 at unity power factor. No additional components or adjustments are required, and it is not frequency sensitive within the practical limits of the transformer typically embracing 50 and 60 Hz.

FIG. 5 shows another embodiment comprising one transformer with two resistors R4 feeding primary 29B' at one end through respective resistors R4 connected to terminals 28B' and 28C' connected to lines L2 and L3, respectively, with line L1 connected to the other end of primary winding 29B' at terminal 28A' connected to line L1. This circuit works in a fashion similar to that in FIG. 4.

Referring to FIG. 6, there is shown a schematic circuit diagram of an exemplary embodiment of a system according to the invention. This schematic circuit diagram with specific parameter values enables those skilled in the art to build this exemplary embodiment of the invention. This embodiment has a number of features.

Trimpot TP3 allows an offset adjustment in calibration circuit 38 to precisely trim the four-milliamp idle loop current. Transistor Q1 buffers loop current regulator 42 and moves heat dissipation off chip for improved accuracy. The intensity of the light provided by LED L1 varies proportionally to the current through the loop to provide an indication of proper loop installation and functioning. Zener diode Z1 across LED L1 carries the loop current if LED L1 should fail. Schottky diode SD1 provides loop reverse polarity protection in the event of an incorrect installation.

Integrated circuit U3 is a rail splitter comprising virtual ground reference source 44.

Factory test loops CT4-1 and CT4-2 allow an idle current measurement to confirm that operational amplifiers 45, 48, U1B, and U2B are operating at less than two milliamps.

The invention disclosed measures voltage on two legs and current on one leg for installation simplicity. However, the same transformer technique may be extended to measuring two current legs and the equivalent of two voltage legs for maximum accuracy and still be loop powered.

Other embodiments are within the claims.

What is claimed is:

1. A dual primary transformer comprising:

a core, first, second and third input terminals, first and second primary windings on said core connected in series between said first and said third terminals at said second terminal, first and second output terminals, a secondary winding on said core connected between said first and second output terminals, a source of a three-phase supply having first, second and third phases coupled to said first, second and third input terminals respectively, said transformer constructed and arranged so that voltage between said first and second output terminals is in phase with the signal on said second input terminal.

2. A single primary transformer circuit comprising, a core, first, second, and third input terminals, a primary winding on said core having first and second ends, said first end coupled to said first input terminal, a first resistor connected between said second input terminal and said second end of said primary winding, a second resistor connected between said third input terminal and said second end of said primary winding, a source of a three-phase supply having first, second and third phases coupled to said first, second and third input terminals respectively, first and second output terminals, and a secondary winding on said core connected between said first and second output terminals, said transformer circuit constructed and arranged so that the voltage between said first and second output terminals is in phase with the signal on said first input terminal.

3. A transformer circuit comprising, a core, first, second and third input terminals, primary winding structure on said core connected between said first and third input terminals and to said second input terminal, first and second output terminals, a secondary winding on said core connected between said first and second output terminals, a source of a three-phase supply having first, second and third phases coupled to said first, second and third input terminals, respectively, said transformer circuit constructed and arranged so that voltage between said first and second output terminals is in phase with the signal on a selected one of said first and second input terminals.

4. A transformer circuit in accordance with claim 3 wherein said primary winding structure comprises first and second primary windings connected in series between said first and third input terminals at said second input terminal, said transformer circuit constructed and arranged so that voltage between said first and second output terminals is in phase with the signal on said second input terminal.

5. A transformer circuit in accordance with claim 3 wherein said primary winding structure comprises a primary winding on said core having first and second ends, said first end coupled to said first input terminal, and further comprising a first resistor connected between said second input terminal and said second end of said primary winding, a second resistor connected between said third input terminal and said second end of said primary winding, said transformer circuit constructed and arranged so that the voltage between said first and second output terminals is in phase with the signal on said first input terminal.

* * * * *